US009178144B1

(12) United States Patent
Sung et al.

(10) Patent No.: US 9,178,144 B1
(45) Date of Patent: Nov. 3, 2015

(54) RRAM CELL WITH BOTTOM ELECTRODE

(71) Applicant: Taiwan Semiconductor Manufacturing Co., Ltd., Hsin-Chu (TW)

(72) Inventors: Fu-Ting Sung, Yangmei (TW);
Shih-Chang Liu, Alian Township (TW);
Chia-Shiung Tsai, Hsin-Chu (TW);
Yu-Wen Liao, New Taipei (TW);
Wen-Ting Chu, Kaohsiung (TW);
Yu-Hsing Chang, Taipei (TW);
Ru-Liang Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/252,111

(22) Filed: Apr. 14, 2014

(51) Int. Cl.
*H01L 45/00* (2006.01)
*H01L 23/538* (2006.01)

(52) U.S. Cl.
CPC .......... *H01L 45/1253* (2013.01); *H01L 23/538* (2013.01); *H01L 45/16* (2013.01)

(58) Field of Classification Search
USPC ............................................................ 257/4
See application file for complete search history.

(56) References Cited

U.S. PATENT DOCUMENTS

| 7,122,854 | B2 | 10/2006 | Fukuzumi |
| 7,220,599 | B2 | 5/2007 | Park et al. |
| 7,582,889 | B2 | 9/2009 | Asano |
| 7,906,817 | B1 | 3/2011 | Wu et al. |
| 8,241,944 | B2 | 8/2012 | Greeley et al. |
| 8,785,238 | B2 | 7/2014 | Kawashima et al. |
| 2001/0049189 | A1 | 12/2001 | Zahorik |
| 2003/0080427 | A1 | 5/2003 | Hudgens et al. |
| 2003/0116794 | A1 | 6/2003 | Lowrey |
| 2005/0127349 | A1 | 6/2005 | Horak et al. |

(Continued)

FOREIGN PATENT DOCUMENTS

| JP | 2006032600 A | 2/2006 |
| KR | 100645064 B1 | 11/2006 |
| WO | 2009154266 A1 | 12/2009 |

OTHER PUBLICATIONS

B.B. Weng, et al.; "ALD HfO2 Based RRAM with Ti Capping"; International Journal of Electrica, Robotics, Electronics and Communications Engineering, vol. 7, No. 9, 2013, p. 1-2.

(Continued)

*Primary Examiner* — Thao P Le
(74) *Attorney, Agent, or Firm* — Eschweiler & Associates, LLC

(57) ABSTRACT

The present disclosure relates to a resistive random access memory (RRAM) cell having a bottom electrode that provides for low leakage currents within the RRAM cell without using insulating sidewall spacers, and an associated method of formation. In some embodiments, the RRAM cell has a bottom electrode disposed over a lower metal interconnect layer surrounded by a lower inter-level dielectric (ILD) layer. A bottom dielectric layer is disposed over the lower metal interconnect layer and/or the lower ILD layer. A dielectric data storage layer having a variable resistance is located above the bottom dielectric layer and the bottom electrode, and a top electrode is disposed over the dielectric data storage layer. Placement of the dielectric data storage layer onto the bottom dielectric layer increases a leakage path distance between the bottom and top electrodes, and thereby provides for low leakage current for the RRAM cell.

20 Claims, 11 Drawing Sheets

(56) References Cited

U.S. PATENT DOCUMENTS

| | | |
|---|---|---|
| 2005/0186768 A1 | 8/2005 | Sugaya et al. |
| 2006/0012029 A1 | 1/2006 | Kikuchi et al. |
| 2006/0046379 A1 | 3/2006 | Symsnczyk et al. |
| 2006/0054878 A1 | 3/2006 | Lowrey |
| 2006/0060909 A1 | 3/2006 | Chi et al. |
| 2006/0072370 A1 | 4/2006 | Kuh et al. |
| 2006/0091476 A1 | 5/2006 | Pinnow et al. |
| 2006/0169968 A1 | 8/2006 | Happ |
| 2007/0120580 A1 | 5/2007 | Kim et al. |
| 2007/0158633 A1 | 7/2007 | Lai et al. |
| 2007/0278470 A1 | 12/2007 | Pellizzer et al. |
| 2008/0006851 A1 | 1/2008 | Moriya et al. |
| 2008/0093591 A1 | 4/2008 | Khang et al. |
| 2008/0093592 A1 | 4/2008 | Moriya |
| 2008/0149910 A1 | 6/2008 | An et al. |
| 2008/0247214 A1 | 10/2008 | Ufert |
| 2008/0293224 A1 | 11/2008 | Son et al. |
| 2008/0303015 A1 | 12/2008 | Happ et al. |
| 2009/0148981 A1 | 6/2009 | Lai et al. |
| 2010/0110758 A1 | 5/2010 | Li et al. |
| 2010/0237313 A1 | 9/2010 | Mikawa et al. |
| 2010/0237317 A1 | 9/2010 | Tsunoda |
| 2010/0252796 A1 | 10/2010 | Noshiro |
| 2010/0323491 A1 | 12/2010 | Moniwa et al. |
| 2011/0049460 A1 | 3/2011 | Breitwisch et al. |
| 2011/0096595 A1* | 4/2011 | Terai .................. 365/163 |
| 2011/0121251 A1 | 5/2011 | Breitwisch et al. |
| 2011/0233696 A1 | 9/2011 | Li |
| 2011/0254126 A1 | 10/2011 | Kreupl et al. |
| 2012/0037875 A1 | 2/2012 | Rolbiecki et al. |
| 2012/0142160 A1 | 6/2012 | Han et al. |
| 2012/0161095 A1 | 6/2012 | Mikawa et al. |
| 2012/0268981 A1 | 10/2012 | Hanzawa et al. |
| 2012/0299063 A1 | 11/2012 | Baba |
| 2013/0001504 A1 | 1/2013 | Ninomiya et al. |
| 2013/0089949 A1 | 4/2013 | Phatak et al. |
| 2013/0099386 A1 | 4/2013 | Lee |
| 2013/0140516 A1 | 6/2013 | Lee et al. |
| 2013/0170291 A1 | 7/2013 | Liu |
| 2013/0187114 A1 | 7/2013 | Kai et al. |
| 2013/0221308 A1 | 8/2013 | Toh et al. |
| 2013/0221310 A1 | 8/2013 | Morikawa et al. |
| 2013/0248795 A1 | 9/2013 | Takahashi et al. |
| 2013/0295745 A1 | 11/2013 | Takahashi et al. |
| 2014/0021584 A1 | 1/2014 | Tu et al. |
| 2014/0034891 A1 | 2/2014 | Wang et al. |
| 2014/0110659 A1 | 4/2014 | Murase et al. |
| 2014/0113430 A1 | 4/2014 | Hayakawa et al. |
| 2014/0124728 A1 | 5/2014 | Kim et al. |
| 2014/0131650 A1 | 5/2014 | Tu et al. |
| 2014/0138600 A1 | 5/2014 | Satoh et al. |
| 2014/0146593 A1 | 5/2014 | Tsai et al. |
| 2014/0151776 A1 | 6/2014 | Beigel et al. |
| 2014/0158964 A1 | 6/2014 | Han et al. |
| 2014/0175366 A1 | 6/2014 | Tu et al. |
| 2014/0179068 A1 | 6/2014 | Samachisa et al. |
| 2014/0203236 A1 | 7/2014 | Chen et al. |
| 2014/0225053 A1 | 8/2014 | Fujii et al. |
| 2014/0227853 A1 | 8/2014 | Matamis et al. |
| 2014/0252297 A1 | 9/2014 | Chang et al. |
| 2014/0264222 A1 | 9/2014 | Yang et al. |
| 2014/0264229 A1* | 9/2014 | Yang et al. .................. 257/4 |
| 2014/0264233 A1 | 9/2014 | Tu et al. |
| 2014/0284543 A1 | 9/2014 | Ishikawa et al. |
| 2015/0090949 A1* | 4/2015 | Chang et al. .................. 257/4 |

OTHER PUBLICATIONS

U.S. Appl. No. 14/513,781, filed Oct. 14, 2014.
Wolf, S. "Silicon Processing for the VLSI Era" vol. 1 copyright 2000 pp. 821.
U.S. Appl. No. 14/041,514, filed Sep. 30, 2013.
Non-Final Office Action dated Nov. 10, 2014 for U.S. Appl. No. 14/041,514.
Notice of Allowance dated Apr. 3, 2015 for U.S. Appl. No. 14/041,514.
Notice of Allowance Dated Aug. 5, 2015 U.S. Appl. No. 14/513,781.

* cited by examiner

RRAM CELL WITH BOTTOM ELECTRODE

BACKGROUND

Many modern day electronic devices contain electronic memory configured to store data. Electronic memory may be volatile memory or non-volatile memory. Volatile memory stores data while it is powered, while non-volatile memory is able to store data when power is removed. Resistive random access memory (RRAM) is one promising candidate for next generation non-volatile memory technology due to its simple structure and CMOS logic compatible process technology that is involved. An RRAM cell includes a dielectric data storage layer having a variable resistance, which is placed between two electrodes disposed within back-end-of-the-line (BEOL) metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
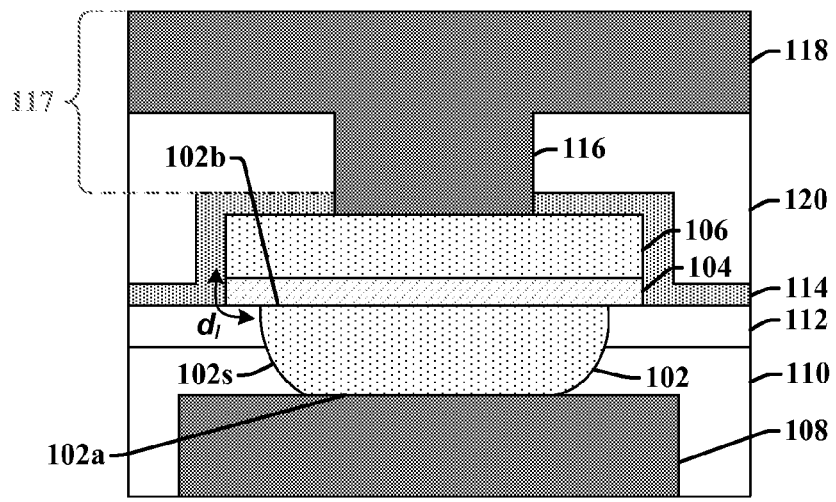
FIG. 1 illustrates a cross-sectional view of some embodiments of resistive random access memory (RRAM) cell having a bottom electrode with a flat top surface that provides for a low leakage current.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) cells have a bottom electrode that is separated from an overlying top electrode by a dielectric data storage layer having a variable resistance. Typically, RRAM cells are separated from an underlying metal layer by a bottom dielectric layer comprising an opening that provides for contact between the bottom electrode and the underlying metal interconnect layer. The bottom electrode is formed over the opening, causing the bottom electrode to have a 'U' shape that extends from within the opening to a position overlying the bottom dielectric layer.

A bottom electrode having such a U shape can cause a number of problems in an RRAM cell. For example, the distance between extensions of the bottom electrode overlying the bottom dielectric layer and the top electrode is relatively small and can cause to leakage currents between the bottom electrode and the top electrode, which lead to degradation of the RRAM cell. To reduce leakage currents within an RRAM cell, the top electrode is typically flanked by insulating sidewall spacers that increase a leakage path distance (i.e., a distance through which a leakage current will travel) between the top electrode and the extension of the bottom electrode. However, insulating sidewall spacers increase the height and width of the RRAM cell making integration into advanced technology nodes (e.g., 28 nm node, 20 nm node, etc.) more difficult. Also, the U shape can lead to microtrenching in an underlying metal interconnect layer, which over many cycles (e.g., 10,000 cycles) can lead to RRAM failure.

Accordingly, the present disclosure relates to a resistive random access memory (RRAM) cell having a bottom electrode with a flat top surface that provides for low leakage currents within the RRAM cell without using insulating sidewall spacers, and an associated method of formation. In some embodiments, the RRAM cell comprises a bottom electrode disposed over a lower metal interconnect layer surrounded by a lower inter-level dielectric (ILD) layer. A bottom dielectric layer is disposed over the lower metal interconnect layer and/or the lower ILD layer. A dielectric data storage layer having a variable resistance is located above the bottom dielectric layer and the bottom electrode, and a top electrode is disposed over the dielectric data storage layer. Placement of the dielectric data storage layer onto the bottom dielectric layer increases a leakage path distance between the bottom electrode and the top electrode, and thereby provides for low leakage current for the RRAM cell without using sidewall spacers that increase the size of the RRAM cell.

FIG. 1 illustrates a cross-sectional view of a resistive random access memory (RRAM) cell 100 having a bottom electrode 102 with a flat top surface that provides for a low leakage current.

The RRAM cell 100 comprises a bottom electrode 102 disposed over a lower metal interconnect layer 108 surrounded by a lower inter-level dielectric (ILD) layer 110. The bottom electrode 102 comprises a top surface 102b and a bottom surface 102a. In some embodiments, the top surface 102b may comprise a flat surface connected to the bottom surface 102a by way of curved sidewalls 102s (i.e., sidewalls having a slope that changes as a function of height). In some embodiments, the bottom surface 102a may also be curved, such that the sidewalls 102s and the bottom surface 102a form a continuous curved surface that extends between opposing sides of the top surface 102b.

A bottom dielectric layer 112 is disposed above the lower metal interconnect layer 108 and/or the lower inter-level dielectric (ILD) layer 110. A variable resistance dielectric data storage layer 104, which is configured to store a data state depending on an applied voltage, is located over the top surface 102b of the bottom electrode 102 and the bottom dielectric layer 112. A top electrode 106 is disposed over the variable resistance dielectric data storage layer 104. Placement of the variable resistance dielectric data storage layer 104 onto the bottom dielectric layer 112 provides for a relatively large leakage path distance $d_l$ (i.e., a distance through which a leakage current will travel) between the bottom electrode 102 and the top electrode 106, thereby providing for low leakage current of the RRAM cell 100.

In some embodiments, a top dielectric layer 114 is disposed over the top electrode 106. The top dielectric layer 114 continuously extends from a position overlying the top electrode 106 to positions abutting sidewalls of the top electrode 106 and the variable resistance dielectric data storage layer 104. The top dielectric layer 114 separates the top electrode 106 and the variable resistance dielectric data storage layer 104 from an upper inter-level dielectric (ILD) layer 120 surrounding an upper metal interconnect layer 117 having an upper metal via 116 and an upper metal wire 118.

Figure 2:
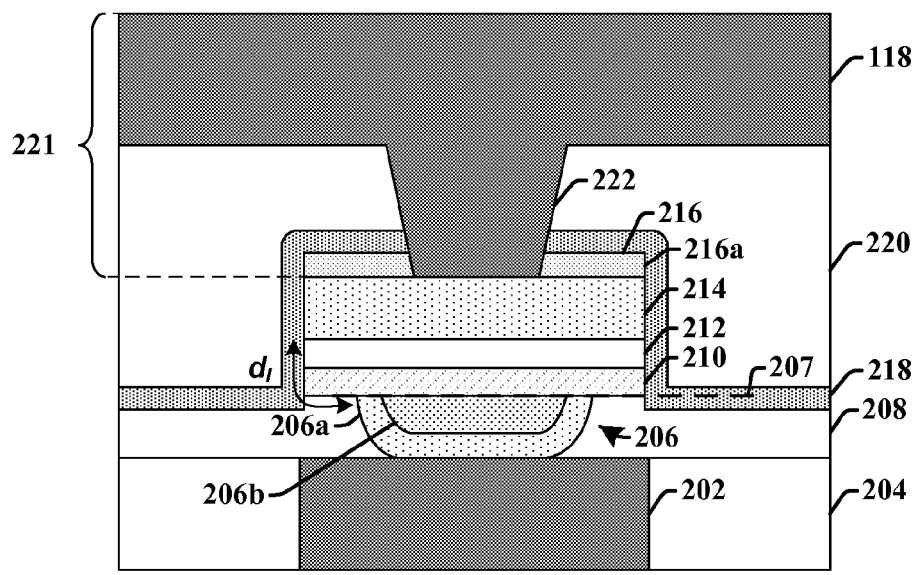
FIG. 2 illustrates a cross-sectional view of some embodiments of RRAM cell having a bottom electrode disposed within a bottom dielectric layer.

FIG. 2 illustrates a cross-sectional view of some embodiments of RRAM cell 200 having a bottom electrode 206 disposed within a bottom dielectric layer 208.

RRAM cell 200 comprises a bottom electrode 206 disposed onto a lower metal interconnect layer 202 surrounded by lower inter-level dielectric (ILD) layer 204 within a BEOL metallization stack. In some embodiments, the lower metal interconnect layer 202 may comprise one of a plurality of metal interconnect layers disposed between the bottom electrode 206 and an underlying semiconductor substrate (not shown).

The bottom electrode 206 comprises a flat top surface that is connected to a bottom surface by way of curved sidewalls. The curved sidewalls abut a surrounding bottom dielectric layer 208. The flat top surface of the bottom electrode 206 and a top surface of the surrounding bottom dielectric layer 208 are aligned along a planar surface 207. In some embodiments, the bottom electrode 206 may comprise a first bottom electrode layer 206a and a second bottom electrode layer 206b. The first bottom electrode layer 206a comprises a 'U' shaped layer that abuts the lower metal interconnect layer 202 and the bottom dielectric layer 208. The second bottom electrode layer 206b is nested within the opening of the 'U' shape of the first bottom electrode layer 206a. The first and second bottom electrode layers, 206a and 206b, have flat top surfaces disposed along the planar surface 207.

A dielectric data storage layer 210 having a variable resistance is disposed onto the top surface of the bottom electrode 206 and the bottom dielectric layer 208. Depending on an applied voltage, the dielectric data storage layer 210 will undergo a reversible change between a high resistance state associated with a first data state (e.g., a '0') and a low resistance state associated with a second data state (e.g., a '1'). For example, a voltage applied to the dielectric data storage layer 210 will induce conductive paths (e.g., oxygen vacancies) to form across the dielectric data storage layer 210, thereby reducing the resistance of the dielectric data storage layer 210. The dielectric data storage layer 210 has a width that is greater than the width of the bottom electrode, so that the dielectric data storage layer 210 extends beyond the bottom electrode 206 on opposing sides.

In some embodiments, a capping layer 212 may be disposed over the dielectric data storage layer 210. The capping layer 212 is configured to store oxygen, which can facilitate resistance changes within the dielectric data storage layer 210. In some embodiments, the capping layer 212 may comprise a metal or a metal oxide that is relatively low in oxygen concentration.

A top electrode 214 is disposed over the capping layer 212. The top electrode 214, the capping layer 212, and the dielectric data storage layer 210 comprise sidewalls that are laterally aligned with one another (i.e., along a vertical plane). Since the dielectric data storage layer 210 extends beyond the bottom electrode 206 on opposing sides, the top electrode 214 is separated from the bottom electrode 206 by a relatively large leakage path distance $d_l$. The relatively large leakage path distance $d_l$ reduces the leakage current in the RRAM cell 200 without using sidewall spacers, thereby allowing for RRAM cell 200 to have a smaller size than RRAM cells using sidewall spacers.

A masking layer 216 (e.g., a hard mask layer) is disposed over the top electrode 214 at positions abutting opposite sidewalls of an upper metal via 222. The masking layer 216 has sidewalls 216a that are aligned with sidewalls of the top electrode 214. In some embodiments, the masking layer 216 may comprise a silicon oxy-nitride (SiON) hard mask layer or a silicon dioxide (SiO$_2$) hard mask layer. In other embodiments, the masking layer 216 may comprise a hard mask layer that is substantially devoid of oxygen. For example, the masking layer 216 may comprise a silicon carbide (SiC) hard mask layer, a silicon-nitride (SiN) hard mask layer, or a composite dielectric film that is substantially devoid of oxygen. Although the use of a masking layer 216 that is substantially devoid of oxygen is described in relation to the RRAM cell of FIG. 2, it will be appreciated that the use of a masking layer 216 that is substantially devoid of oxygen is not limited to such a RRAM cell structure. Rather, the use of a masking layer 216 that is substantially devoid of oxygen may be used with any RRAM cell structure (e.g., an RRAM cell having any shape of bottom electrode, RRAM cell having bottom electrodes that extends over bottom dielectric layer 208, etc.).

A top dielectric layer 218 is disposed onto the masking layer 216. The top dielectric layer 218 continuously extends along sidewalls of the dielectric data storage layer 210, the capping layer 212, the top electrode 214, and the masking layer 216, from a first position abutting a top surface of the masking layer 216 to a second position abutting a top surface of the bottom dielectric layer 208. The top dielectric layer 218 separates the dielectric data storage layer 210, the capping layer 212, the top electrode 214, and the masking layer 216 from an upper inter-level dielectric (ILD) layer 220. The upper ILD layer 220 surrounds an upper metal interconnect layer 221 disposed onto the top electrode 214. The upper metal interconnect layer 221 comprises the upper metal via 222, which extends from the top electrode 214, through the masking layer 216 and the top dielectric layer 218, to an upper metal wire 118.

Figure 3:
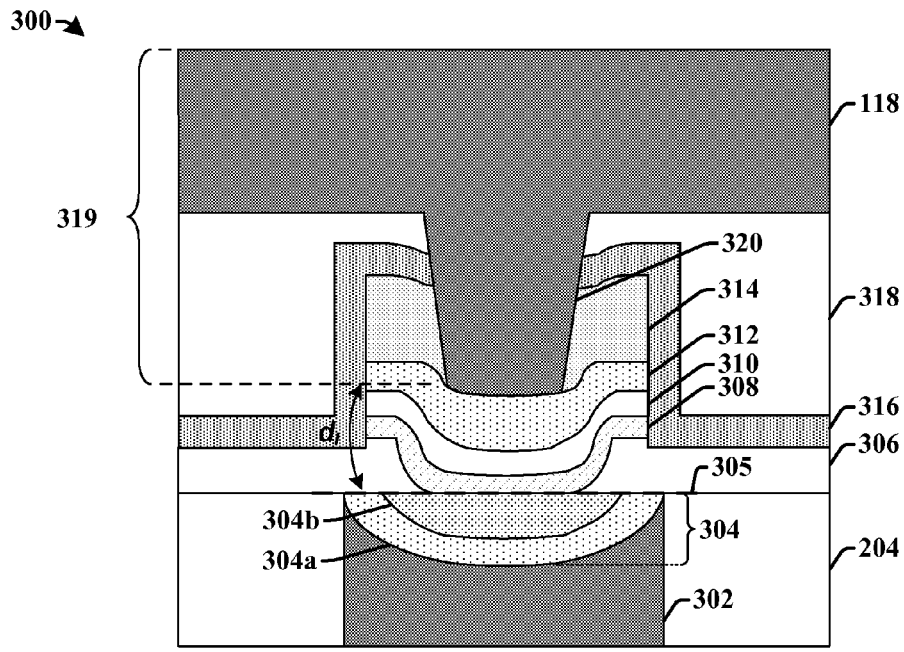
FIG. 3 illustrates a cross-sectional view of some embodiments of RRAM cell having a bottom electrode disposed within a lower metal interconnect layer.

FIG. 3 illustrates a cross-sectional view of some embodiments of RRAM cell 300 having a bottom electrode 304 disposed within a lower metal interconnect layer 302.

RRAM cell 300 comprises a bottom electrode 304 disposed within a lower metal interconnect layer 302 surrounded by lower inter-level dielectric (ILD) layer 204. The bottom electrode 304 comprises a flat top surface that is connected to a curved bottom surface by way of curved sidewalls, such that the sidewalls and the bottom surface form a continuous curved surface that extends between opposing sides of the flat top surface. The bottom surface of the bottom electrode 304 has a convex curvature that abuts a concave top surface of the lower metal interconnect layer 302. The flat top surface of the bottom electrode 304 is aligned with a top surface of the lower ILD layer 204 along a planar surface 305. In some embodiments, the bottom electrode 304 may comprise a first bottom electrode layer 304a having a 'U' shaped layer that is disposed onto the lower metal interconnect layer 302, and a second bottom electrode layer 304b is nested within the opening of the U shape of the first bottom electrode layer 304a. The first and second bottom electrode layers, 304a and 304b, have flat top surfaces disposed along the planar surface 305.

A bottom dielectric layer 306 is disposed over the lower ILD layer 204 and the bottom electrode 304. The bottom dielectric layer 306 comprises an opening that provides for contact between the bottom electrode 304 and a dielectric data storage layer 308. The dielectric data storage layer 308 is disposed over the opening, causing the dielectric data storage layer 308 to have a non-planar topography that extends from within the opening to a position overlying the bottom dielectric layer 306. A capping layer 310 having a non-planar topography is disposed over the dielectric data storage layer 308, and a top electrode 312 having a non-planar topography is disposed over the dielectric data storage layer 308. Since the bottom dielectric layer 306 is disposed between the top electrode 312 and the bottom electrode 304, the top electrode 312 is separated from the bottom electrode 304 by a relatively large leakage path distance $d_l$. The relatively large leakage path distance $d_l$ reduces the leakage current in the RRAM cell 300 without using sidewall spacers, thereby allowing for RRAM cell 300 to have a smaller size than RRAM cells using sidewall spacers.

A masking layer 314 having a non-planar topography is disposed over the top electrode 312. In some embodiments, the masking layer 314 may comprise a hard mask layer that is substantially devoid of oxygen. A top dielectric layer 316 continuously extends from a first position abutting a top surface of the masking layer 314 to a second position abutting a top surface of the bottom dielectric layer 306. The top dielectric layer 316 has a first side that abuts the dielectric data storage layer 308, the capping layer 310, the top electrode 312, and the masking layer 314, and a second side that abuts an upper inter-level dielectric (ILD) layer 318. The upper ILD layer 318 surrounds an upper metal interconnect layer 319 comprising an upper metal via 320 configured to extend from the top electrode 312, through the masking layer 314 and the top dielectric layer 316, to an upper metal wire 118.

Figure 4:
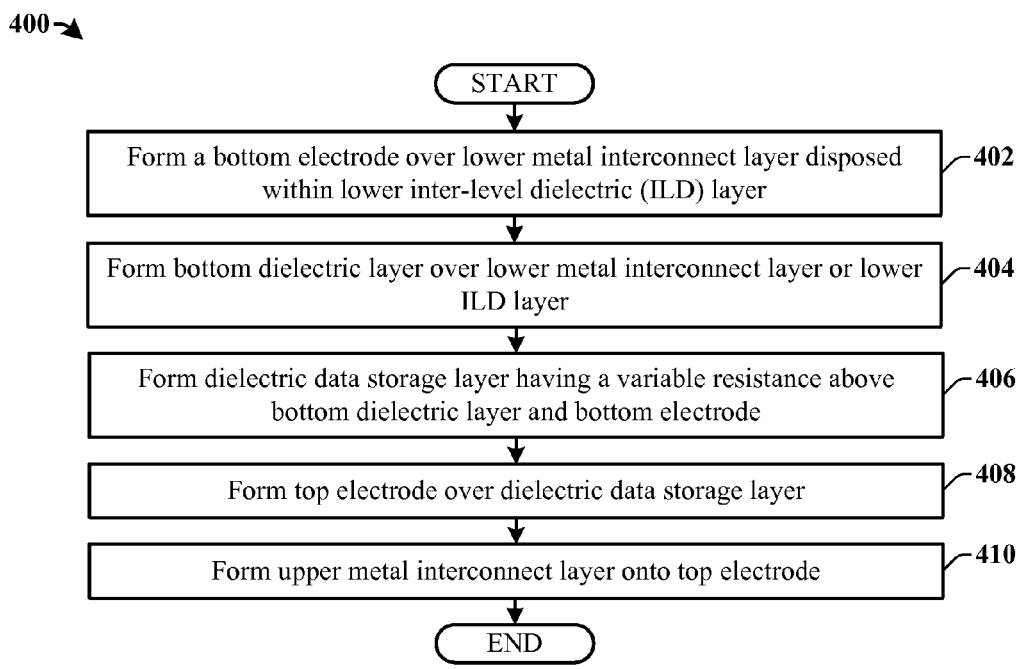
FIG. 4 illustrates a flow diagram of some embodiments of a method of forming a RRAM cell having a bottom electrode comprising a flat top surface connected to a bottom surface by way of curved sidewalls.

FIG. 4 illustrates a flow diagram of some embodiments of a method 400 of forming a RRAM cell having a bottom electrode with a flat top that provides for a low leakage current.

At 402, a bottom electrode is formed over a lower metal interconnect layer comprised within a lower inter-level dielectric (ILD) layer. In some embodiments, the bottom electrode may comprise a flat top surface connected to a bottom surface by way of curved sidewalls.

At 404, a bottom dielectric layer is formed over the lower metal interconnect layer or the lower ILD layer.

At 406, a dielectric data storage layer having a variable resistance is formed above the bottom dielectric layer and the bottom electrode. In some embodiments, the dielectric data storage layer may be formed onto and in direct contact with the bottom dielectric layer and the bottom electrode.

At 408, a top electrode is formed over dielectric data storage layer.

At 410, an upper metal interconnect layer is formed over the top electrode.

Figure 5:
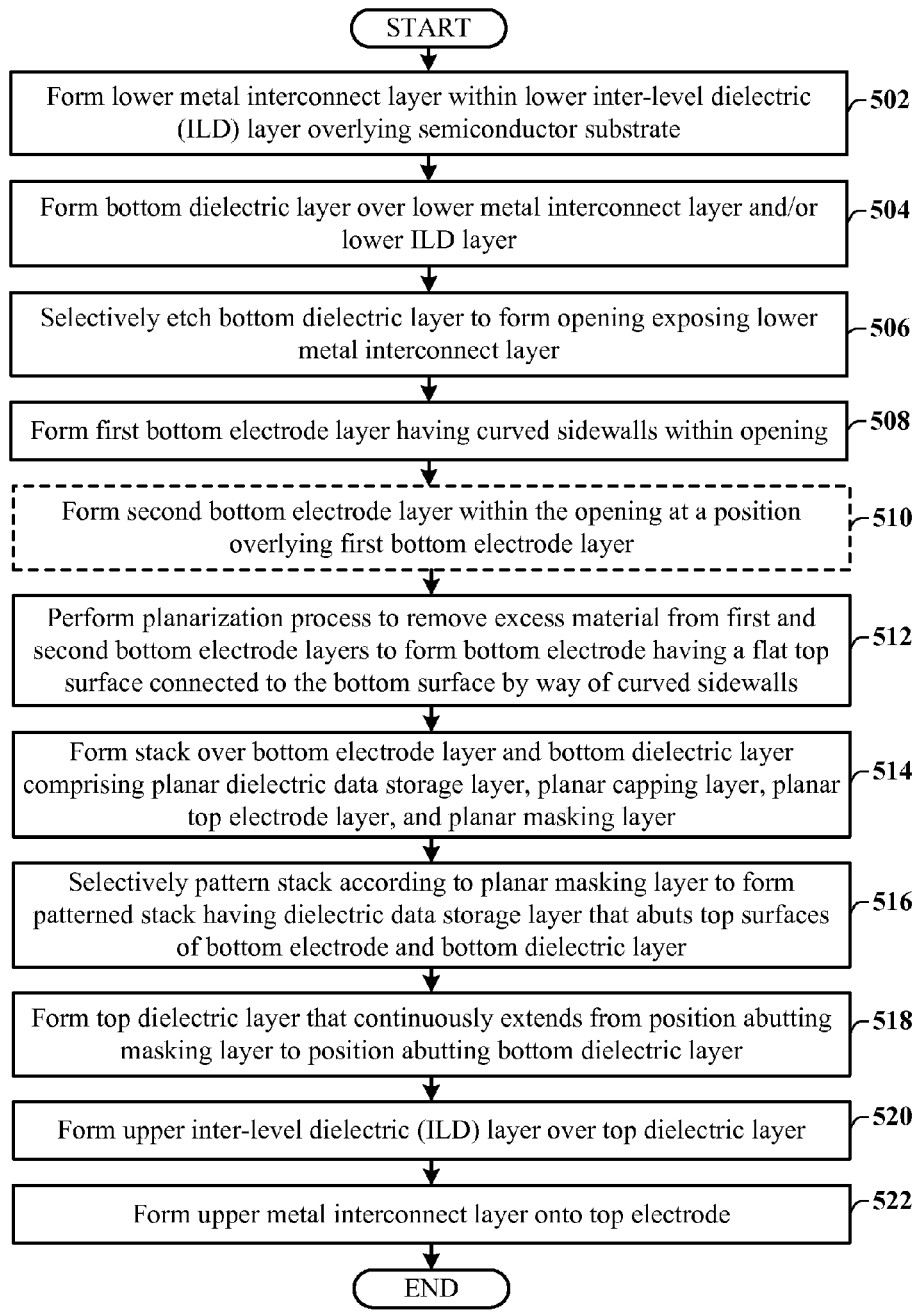
FIG. 5 illustrates a flow diagram of some alternative embodiments of a method of forming a RRAM cell having a bottom electrode disposed within a bottom dielectric layer.

FIG. 5 illustrates a flow diagram of some embodiments of a method 500 of forming a RRAM cell having a bottom electrode disposed within a bottom dielectric layer.

While disclosed methods (e.g., methods 400, 500, and 1400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a lower metal interconnect layer is formed within a lower inter-level dielectric (ILD) layer disposed over a semiconductor substrate.

At 504, a bottom dielectric layer is formed over the lower metal interconnect layer and/or the lower ILD layer.

At 506, the bottom dielectric layer is selectively etched to form an opening that extends through the bottom dielectric layer to expose the lower metal interconnect layer.

At 508, a first bottom electrode layer having curved sidewalls is formed within the opening. In some embodiments, the first bottom electrode layer may comprise a first material.

At 510, a second bottom electrode layer may be formed within the opening at a position overlying the first bottom electrode layer, in some embodiments. The second bottom electrode layer is nested within the first bottom electrode layer and also has curved sidewalls. In some embodiments, the second bottom electrode layer may comprise a second material different than the first material.

At 512, a planarization process is performed to remove excess material from the first bottom electrode layer and the second bottom electrode layer. The planarization process forms a bottom electrode having a flat top surface that is located along a plane aligned with a top surface of the bottom dielectric layer.

At 514, a stack is formed over the bottom electrode layer and the bottom dielectric layer. The stack comprises a planar dielectric data storage layer, a planar capping layer disposed onto the planar dielectric data storage layer, a planar top electrode layer disposed onto the planar capping layer, and a planar masking layer disposed onto the planar top electrode.

At 516, the stack is selectively patterned according to the planar masking layer to form a patterned stack having a dielectric data storage layer that abuts top surfaces of the bottom electrode and the bottom dielectric layer.

At 518, a top dielectric layer is formed over the patterned stack. The top dielectric layer continuously extends from position abutting planar masking layer to position abutting bottom dielectric layer.

At 520, an upper inter-level dielectric (ILD) layer is formed over the top dielectric layer.

At 522, an upper metal interconnect layer is formed onto the top electrode. The upper metal interconnect layer comprises an upper metal via formed at a position in contact with the top electrode, and an upper metal wire formed in contact with the upper metal via.

FIGS. 6-13 illustrate some embodiments of cross-sectional views showing a method of forming a RRAM cell having a bottom electrode disposed within a bottom dielectric layer. Although FIGS. 6-13 are described in relation to method 500, it will be appreciated that the structures disclosed in FIGS. 6-13 are not limited to such a method, but instead may stand alone as structures independent of the method.

Figure 6:
FIGS. 6-13 illustrate cross-sectional views of some alternative embodiments showing a method of forming a RRAM cell having a bottom electrode disposed within a bottom dielectric layer.

FIG. 6 illustrates some embodiments of a cross-sectional view 600 corresponding to acts 502-504.

As shown in cross-sectional view 600, a lower metal interconnect layer 202 is formed within a lower inter-level dielectric (ILD) layer 204. In some embodiments, the lower metal interconnect layer 202 may be formed by selectively etching the lower ILD layer 204 (e.g., an oxide, a low-k dielectric, or an ultra low-k dielectric) to form an opening in the lower ILD layer 204. A metal (e.g., copper, aluminum, etc.) is then deposited to fill the opening, and a planarization process is performed to remove excess metal to form the lower metal interconnect layer 202.

A bottom dielectric layer 602 is formed onto the lower metal interconnect layer 202 and/or the lower ILD layer 204. In some embodiments, the bottom dielectric layer 602 may comprise silicon-nitride (SiN), silicon-carbide (SiC), or a similar composite dielectric film. In some embodiments, the bottom dielectric layer 602 may be formed by a vapor deposition technique (e.g., physical vapor deposition, chemical vapor deposition, etc.).

Figure 7:
Figure 7:
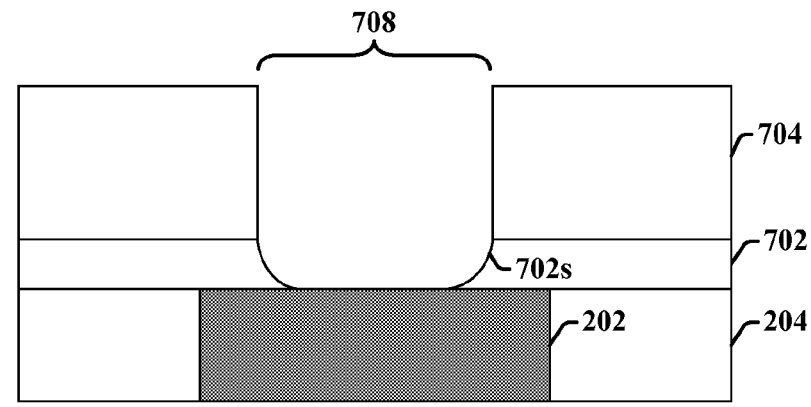

FIG. 7 illustrates some embodiments of a cross-sectional view 700 corresponding to act 506.

As shown in cross-sectional view 700, a first masking layer 704 is formed over the bottom dielectric layer 702. The bottom dielectric layer 702 is the selectively exposed to an etchant 706 (e.g., a dry etchant) in areas not covered by the first masking layer 704. The etchant 706 forms an opening 708 in the bottom dielectric layer 702, which extends through the bottom dielectric layer 702 to the lower metal interconnect layer 202. The opening 708 may have curved sidewalls 702s (i.e., sidewalls having a slope that changes as a function of height).

Figure 8:
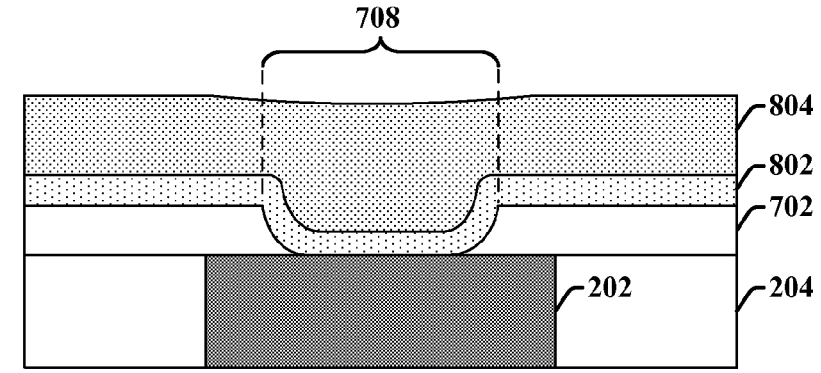

FIG. 8 illustrates some embodiments of a cross-sectional view 800 corresponding to acts 508-510.

As shown in cross-sectional view 700, a first bottom electrode layer 802 is formed within the opening 708. The first bottom electrode layer 802 extends from within the opening 708 to a position overlying the bottom dielectric layer 702. In some embodiments, the first bottom electrode layer 802 may comprise tantalum (Ta) or tantalum nitride (TaN), for example. A second bottom electrode layer 804 is formed within the opening at a position overlying the first bottom electrode layer 802. The second bottom electrode layer 804 extends from within the opening 708 to a position overlying the bottom dielectric layer 702. In some embodiments, the second bottom electrode layer 804 may comprise titanium (Ti) or titanium nitride (TiN), for example.

Figure 9:
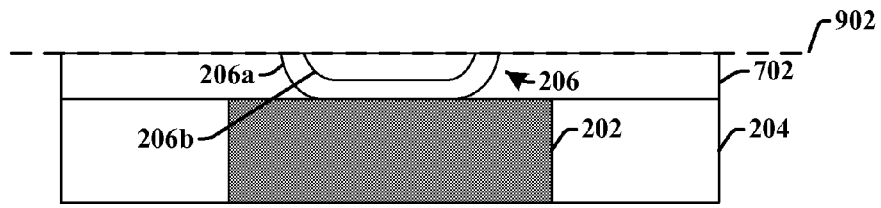

FIG. 9 illustrates some embodiments of a cross-sectional view 900 corresponding to act 512.

As shown in cross-sectional view 900, a planarization process is performed to form a flat surface along line 902 by removing excess materials from the first and second bottom electrode layers, 206a and 206b. The planarization process results in a bottom electrode 206 having a flat top surface connected to the bottom surface by way of curved sidewalls. The flat top surface of the bottom electrode 206 is aligned with the top surface of the bottom dielectric layer 702. In some embodiments, the planarization process may comprise a chemical mechanical polishing (CMP) process.

Figure 10:
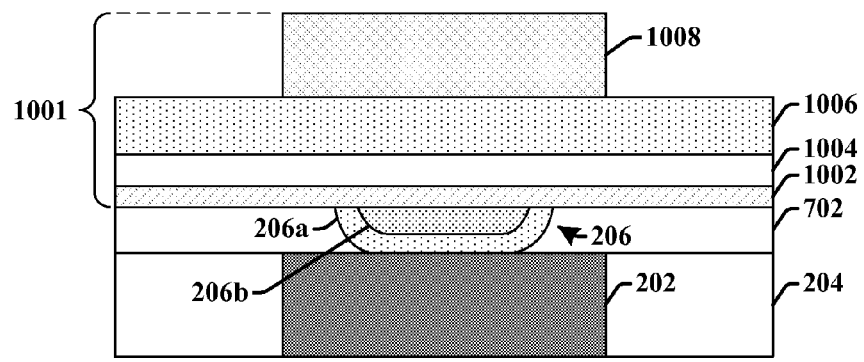

FIG. 10 illustrates some embodiments of a cross-sectional view 1000 corresponding to act 514.

As shown in cross-sectional view 1000, a stack 1001 is formed over the bottom electrode 206 and the bottom dielectric layer 702. The stack 1001 comprises a planar dielectric data storage layer 1002, a planar capping layer 1004 overlying the planar dielectric data storage layer 1002, a planar top electrode layer 1006 overlying the planar capping layer 1004, and a planar masking layer 1008 overlying the planar top electrode layer 1006. The planar masking layer 1008 is configured to define a top electrode of the RRAM cell. In some embodiments, the different layers of the stack 1001 may be deposited by way of vapor deposition techniques (e.g., physical vapor deposition, chemical vapor deposition, etc.).

In some embodiments, the planar dielectric data storage layer 1002 may comprise a high-k dielectric material having a variable resistance. For example, in some embodiments, the planar dielectric data storage layer 1002 may comprise hafnium oxide ($HfO_X$), zirconium oxide ($ZrO_X$), aluminum oxide ($AlO_X$), nickel oxide ($NiO_X$) tantalum oxide ($TaO_X$), or titanium oxide ($TiO_X$). In some embodiments, the planar capping layer 1004 may comprise a metal such as titanium (Ti), hafnium (Hf), platinum (Pt), ruthenium (Ru), and/or aluminum (Al). In other embodiments, the planar capping layer 1004 may comprise a metal oxide such as titanium oxide ($TiO_X$), hafnium oxide ($HfO_X$), zirconium oxide ($ZrO_X$), germanium oxide ($GeO_X$), cesium oxide ($CeO_X$). In various embodiments, the planar top electrode layer 1006 may comprise a metal nitride (e.g., titanium nitride (TiN) or tantalum nitride (TaN)) or a metal (e.g., titanium (Ti) or tantalum (Ta)). In some embodiments, the planar masking layer 1008 may comprise an oxygen containing hard mask layer, such as silicon-oxide ($SiO_2$) or silicon-oxynitride (SiON). In other embodiments, the planar masking layer 1008 may comprise a hard mask layer that is substantially devoid of oxygen, such as silicon-nitride (SiN) silicon-carbide (SiC), or a composite dielectric film that is substantially devoid of oxygen.

Figure 11:
Figure 11:
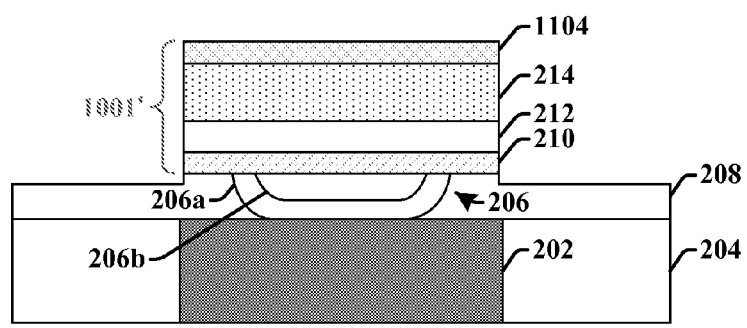

FIG. 11 illustrates some embodiments of a cross-sectional view 1100 corresponding to act 516.

As shown in cross-sectional view 1100, the stack 1001 is patterned according to the planar masking layer 1104. The stack 1001 may be patterned to form a patterned stack 1001' by selectively exposing the stack 1001 to an etchant 1102 in areas not covered by the planar masking layer 1104. The patterned stack 1001' has a dielectric data storage layer 210 that abuts top surfaces of the bottom electrode 206 and the bottom dielectric layer 208. In some embodiments, the etchant 1102 may comprise a dry etchant.

It has been appreciated that using a planar masking layer 1008 that is substantially devoid of oxygen can increase yield of an associated RRAM cell. This is because during patterning of the stack 1001, the etchant 1102 may dissociate oxygen radicals from an oxygen containing masking layer (e.g., such as $SiO_2$ or SiON). The dissociated oxygen radicals can subsequently be implanted into the top electrode 214, the capping layer 212, and/or the dielectric layer 210, where the oxygen radicals lead to device failure (e.g., disturb formation of RRAM filament and resetting the RRAM filament). Using a planar masking layer 1008 that is substantially devoid of oxygen eliminates such oxygen radicals during patterning of the stack 1001, leading to a yield increase (e.g., of up to %30 or more).

Although, the use of a planar masking layer 1008 that is substantially devoid of substantially oxygen is described with relation to FIGS. 10-11, it will be appreciated that the use of a planar masking layer 1008 that is substantially devoid of oxygen (e.g., to pattern a top electrode and/or a bottom electrode) is not limited to such a method or to such a RRAM cell structures. Rather, the use of a planar masking layer 1008 that is substantially devoid may be used with any method of RRAM formation and/or with any RRAM cell structures.

Figure 12:
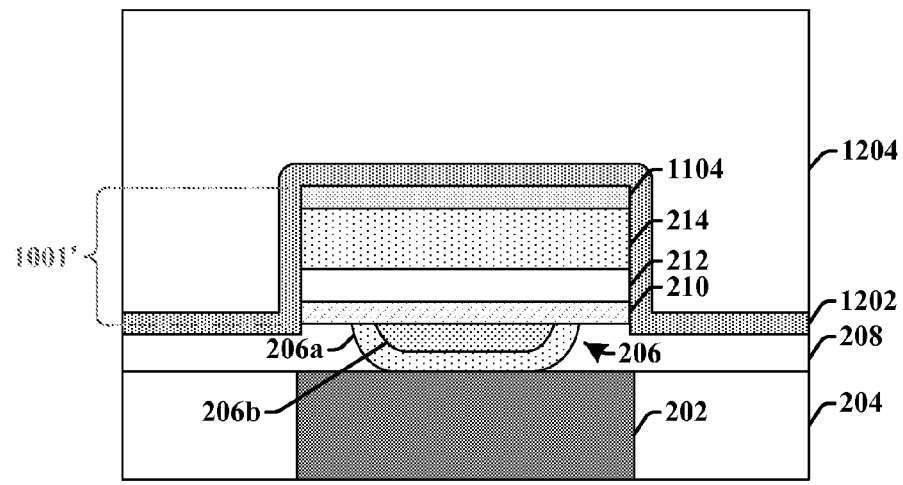

FIG. 12 illustrates some embodiments of a cross-sectional view 1200 corresponding to acts 518-520.

As shown in cross-sectional view 1200, a top dielectric layer 1202 is formed over patterned stack 1001'. An upper inter-level dielectric (ILD) layer 1204 is disposed over the top dielectric layer 1202. The top dielectric layer 1202 has a first side that abuts the dielectric data storage layer 210, the capping layer 212, the top electrode 214, and the masking layer 1104, and a second side that abuts the upper ILD layer 1204.

Figure 13:
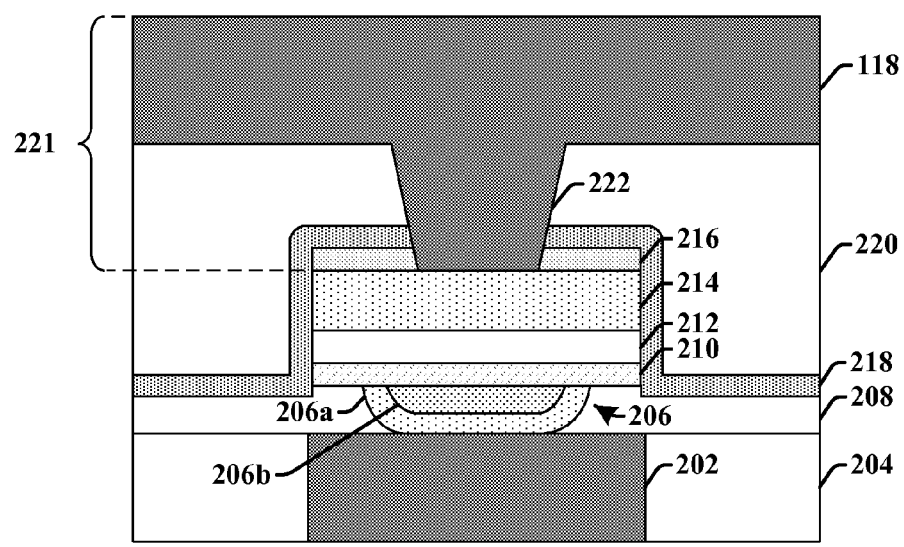

FIG. 13 illustrates some embodiments of a cross-sectional view 1300 corresponding to act 522.

As shown in cross-sectional view 1300, an upper metal interconnect layer 221 is formed at a position abutting the top electrode 214. In some embodiments, the upper metal interconnect layer 221 comprises an upper metal via 222 and an upper metal wire 118. In some embodiments, the upper metal interconnect layer 221 may be formed by etching the upper ILD layer 220 to form an opening that extends through the top dielectric layer 218 and the masking layer 216 to the top electrode 214. The opening is then filed with a metal to form an upper metal via 222, which extends from a top surface of the top electrode 214 to the upper metal wire 118.

Figure 14:
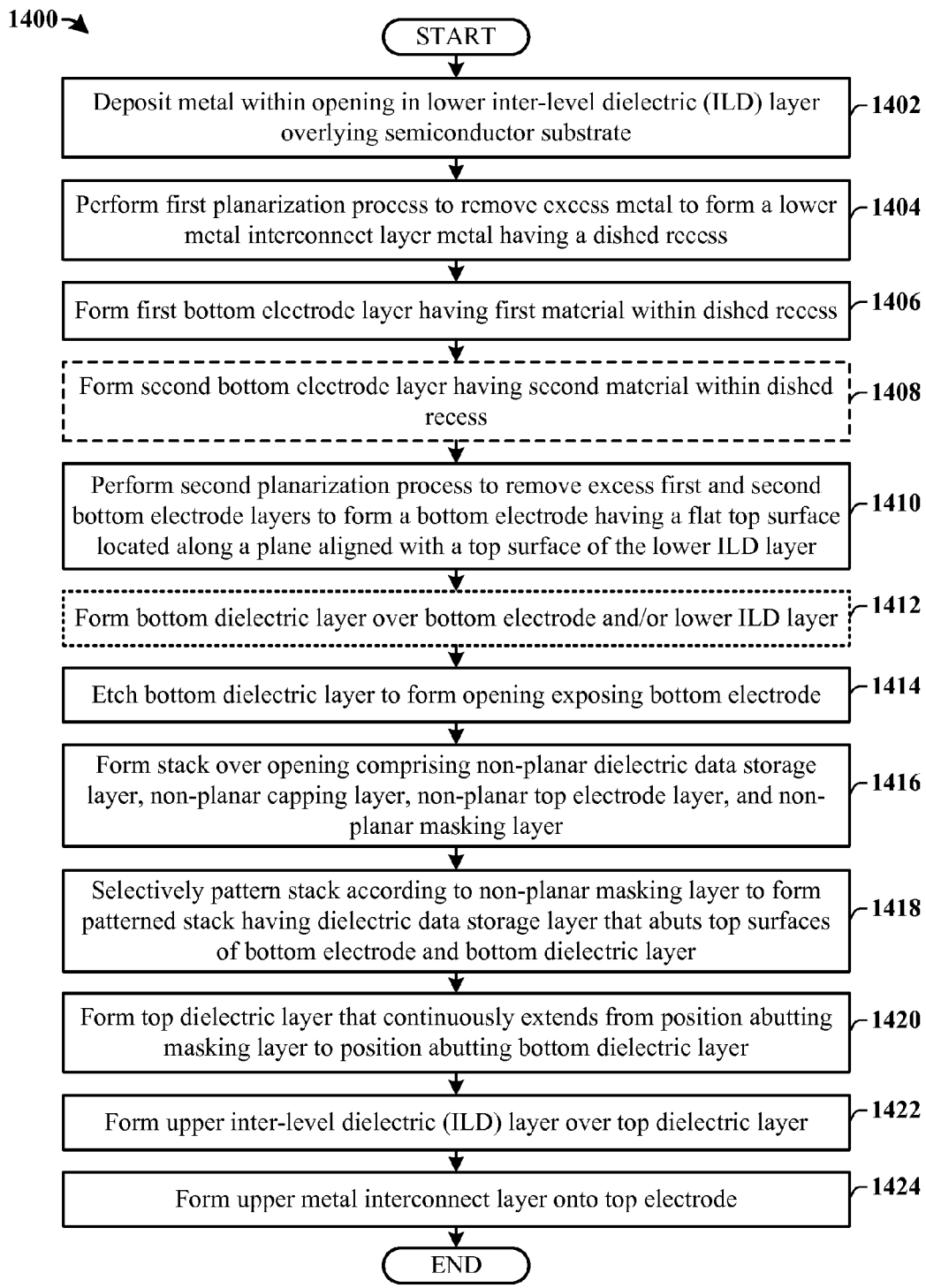
FIG. 14 illustrates a flow diagram of some alternative embodiments of a method of forming a RRAM cell having a bottom electrode disposed within a lower metal interconnect layer.

FIG. 14 illustrates a flow diagram of some alternative embodiments of a method 1400 of forming a RRAM cell having a bottom electrode disposed within a lower metal interconnect layer.

At 1402, a metal is deposited within an opening in a lower inter-level dielectric (ILD) layer overlying a semiconductor substrate.

At 1404, a first planarization process is performed to remove excess metal to form a lower metal interconnect layer. The first planarization process forms a dished recess within a top surface of the lower metal interconnect layer.

At 1406, a first bottom electrode layer is formed within the dished recess. In some embodiments, the first bottom electrode layer may comprise a first material.

At 1408, a second bottom electrode layer may be formed within the dished recess at a position overlying the first bottom electrode layer, in some embodiments. The second bottom electrode layer is nested within the first bottom electrode layer. In some embodiments, the second bottom electrode layer may comprise a second material different than the first material.

At 1410, a second planarization process is performed to remove excess material from the first bottom electrode layer and the second bottom electrode layer. The planarization process forms a bottom electrode having a flat top surface that is located along a plane aligned with a top surface of the lower ILD layer.

At 1412, a bottom dielectric layer is formed over the bottom electrode and/or the lower ILD layer.

At 1414, the bottom dielectric layer is selectively etched to form opening that extends through the bottom dielectric layer to expose the bottom electrode.

At 1416, a stack is formed over the opening in the bottom dielectric layer. The stack comprises a non-planar dielectric data storage layer, a non-planar capping layer disposed onto the non-planar dielectric data storage layer, a non-planar top electrode layer disposed onto the non-planar capping layer, and a non-planar masking layer disposed onto the non-planar top electrode.

At 1418, the stack is selectively patterned according to the non-planar masking layer to form a patterned stack having a dielectric data storage layer that abuts top surfaces of the bottom electrode and the bottom dielectric layer.

At 1420, a top dielectric layer is formed over the stack. The top dielectric layer continuously extends from position abutting masking non-planar layer to position abutting bottom dielectric layer.

At 1422, an upper inter-level dielectric (ILD) layer is formed over the top dielectric layer.

At 1424, an upper metal interconnect layer is formed onto the top electrode. The upper metal interconnect layer comprises an upper metal via formed at a position in contact with the top electrode, and an upper metal wire formed in contact with the upper metal via.

FIGS. 15-24 illustrate some embodiments of cross-sectional views showing a method of forming a RRAM cell disposed within a lower metal interconnect layer. Although FIGS. 15-24 are described in relation to method 1400, it will be appreciated that the structures disclosed in FIGS. 15-24 are not limited to such a method, but instead may stand alone as structures independent of the method.

Figure 15:
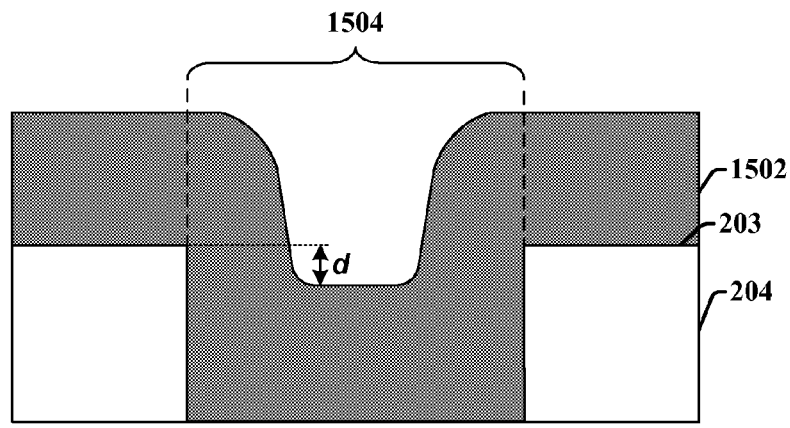
FIGS. 15-24 illustrate cross-sectional views of some alternative embodiments showing a method of forming a RRAM cell having a bottom electrode disposed within a lower metal interconnect layer.

FIG. 15 illustrates some embodiments of a cross-sectional view 1500 corresponding to act 1402.

As shown in cross-sectional view 1500, a metal 1502 (e.g., copper) is deposited within an opening 1504 in a lower inter-level dielectric (ILD) layer 204 (e.g., an oxide, a low-k dielectric, or an ultra low-k dielectric). The opening 1504 in the lower ILD layer 204 may be formed by selectively etching the lower ILD layer 204. The metal 1502 is deposited to a thickness that causes the metal 1502 within the opening 1504 to be recessed a distance d below a top surface 203 of the lower ILD layer 204.

Figure 16:
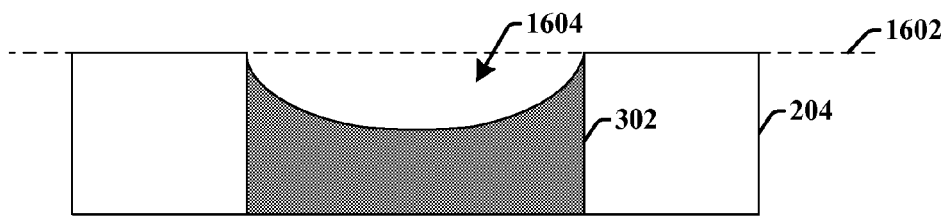

FIG. 16 illustrates some embodiments of a cross-sectional view 1600 corresponding to act 1404.

As shown in cross-sectional view 1600, a first planarization process (e.g., a chemical mechanical polishing (CMP) process) is performed to remove excess metal 1502 to form a planar surface along line 1602. The first planarization process results in the formation of a lower metal interconnect layer 302. Because the metal 1502 was recessed below the top surface 203 of the lower ILD layer 204, the planarization process results in a dished recess 1604 having a curved bottom surface abutting a top surface of the lower metal interconnect layer 302.

Figure 17:
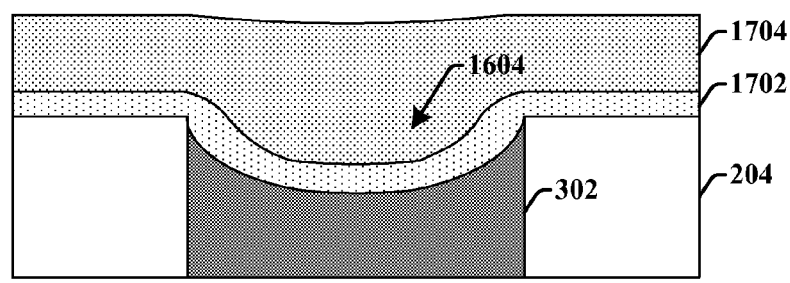

FIG. 17 illustrates some embodiments of a cross-sectional view 1700 corresponding to acts 1406-1408.

As shown in cross-sectional view 700, a first bottom electrode layer 1702 is formed within the dished recess 1604. The first bottom electrode layer 1702 extends from within the dished recess 1604 to a position overlying the lower ILD layer 204. The bottom surface of the first bottom electrode layer 1702 has a convex curvature that abuts a concave top surface of the lower metal interconnect layer 302. In some embodiments, the first bottom electrode layer 1702 may comprise a first material (e.g., Ta, TaN). A second bottom electrode layer 1704 is formed within the dished recess 1604 a position overlying the first bottom electrode layer 1702. The second bottom electrode layer 1704 extends from within the dished recess 1604 to a position overlying the lower ILD layer 204.

In some embodiments, the second bottom electrode layer 1704 may comprise a first material (e.g., Ti, TiN) different than the first material.

Figure 18:
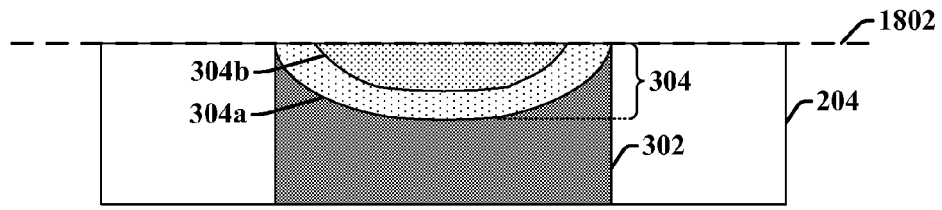

FIG. 18 illustrates some embodiments of a cross-sectional view 1800 corresponding to act 1410.

As shown in cross-sectional view 1800, a second planarization process (e.g., a CMP process) is performed to form a planar surface along line 1802 by removing excess materials from the first and second bottom electrode layers, 304a and 304b. The second planarization process results in a bottom electrode 304 having a flat top surface connected to the bottom surface by way of curved sidewalls. The flat top surface of the bottom electrode 304 is aligned with the top surface of the lower ILD layer 204.

Figure 19:
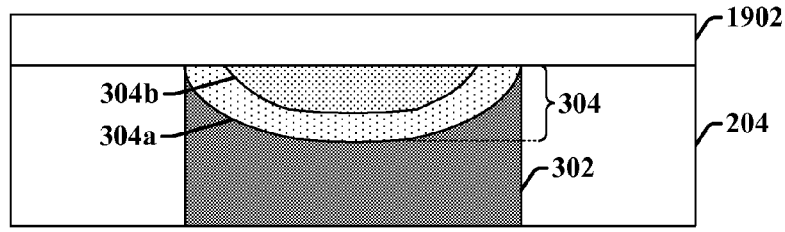

FIG. 19 illustrates some embodiments of a cross-sectional view 1900 corresponding to act 1412.

As shown in cross-sectional view 900, a bottom dielectric layer 1902 is formed onto the bottom electrode 304 and the lower ILD layer 204. In some embodiments, the bottom dielectric layer 1902 may comprise a silicon nitride or a silicon carbide layer formed by a vapor deposition technique (e.g., physical vapor deposition, chemical vapor deposition, etc.).

Figure 20:
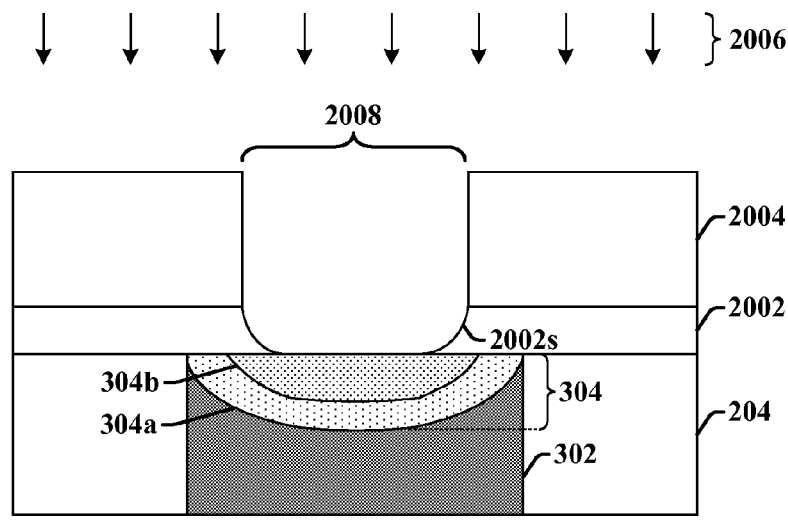

FIG. 20 illustrates some embodiments of a cross-sectional view 2000 corresponding to act 1414.

As shown in cross-sectional view 2000, a first masking layer 2004 is formed over the bottom dielectric layer 2002. The bottom dielectric layer 2002 is the selectively exposed to an etchant 2006 in areas not covered by the first masking layer 2004. The etchant 2006 forms an opening 2008 in the bottom dielectric layer 2002, which extends through the bottom dielectric layer 2002 to the bottom electrode 304. The opening 2008 has curved sidewalls 2002s.

Figure 21:
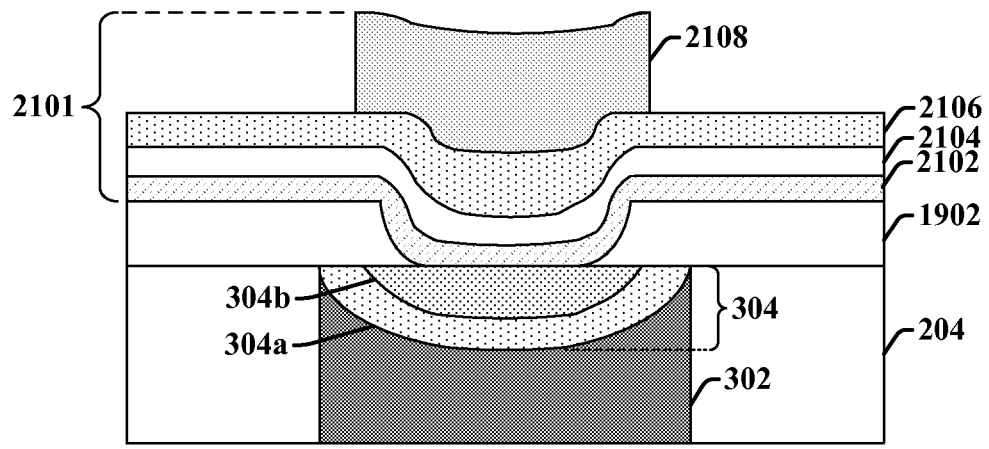

FIG. 21 illustrates some embodiments of a cross-sectional view 2100 corresponding to act 1416.

As shown in cross-sectional view 2100, a stack 2101 is formed over the bottom electrode 304 and the bottom dielectric layer 1902. The stack 2101 comprises a non-planar dielectric data storage layer 2102 having a variable resistance, a non-planar capping layer 2104 overlying the non-planar dielectric data storage layer 2102, a non-planar top electrode layer 2106 overlying the non-planar capping layer 2104, and a non-planar masking layer 2108 overlying the non-planar top electrode layer 2106. The non-planar masking layer 2108 is configured to define a top electrode of the RRAM cell. In some embodiments, the non-planar masking layer 2108 may comprise an oxygen containing hard mask layer, such as silicon-oxide ($SiO_2$) or silicon-oxynitride (SiON). In other embodiments, the non-planar masking layer 2108 may comprise a material that is substantially devoid of oxygen, such as silicon-nitride (SiN), silicon-carbide (SiC) or a composite dielectric film that is substantially devoid of oxygen. In some embodiments, the different layers of the stack 2101 may be deposited by way of vapor deposition techniques (e.g., physical vapor deposition, chemical vapor deposition, etc.).

Figure 22:
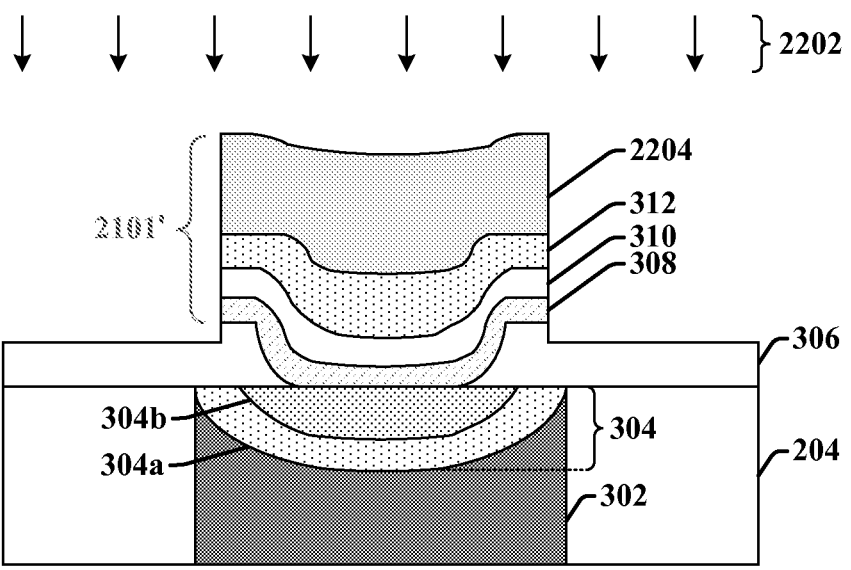

FIG. 22 illustrates some embodiments of a cross-sectional view 2200 corresponding to act 1418.

As shown in cross-sectional view 2200, the stack 2101 is patterned according to the non-planar masking layer 2204. The stack 2101 may be patterned to form a patterned stack 2101' by selectively exposing the stack 2101 to an etchant 2202 in areas not covered by the non-planar masking layer 2204. The patterned stack 2101' has a dielectric data storage layer 308 that abuts top surfaces of the bottom electrode 304 and the bottom dielectric layer 306.

Figure 23:
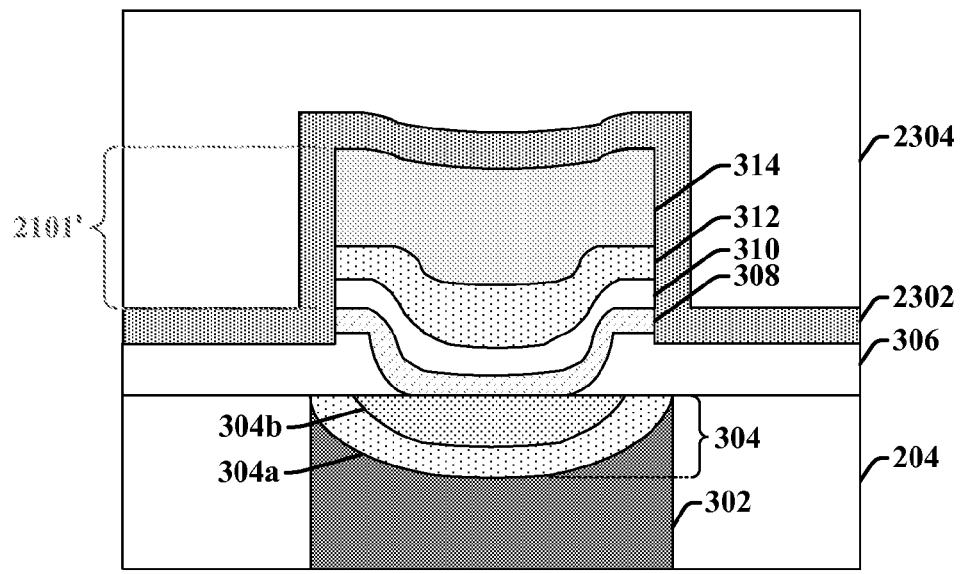

FIG. 23 illustrates some embodiments of a cross-sectional view 2300 corresponding to acts 1420-1422.

As shown in cross-sectional view 2300, a top dielectric layer 2302 is formed over patterned stack 2101'. An upper inter-level dielectric (ILD) layer 2304 is disposed over the top dielectric layer 2302. The top dielectric layer 2302 has a first side that abuts the dielectric data storage layer 308, the capping layer 310, the top electrode 312, and the masking layer 314, and a second side that abuts the upper ILD layer 2304.

Figure 24:
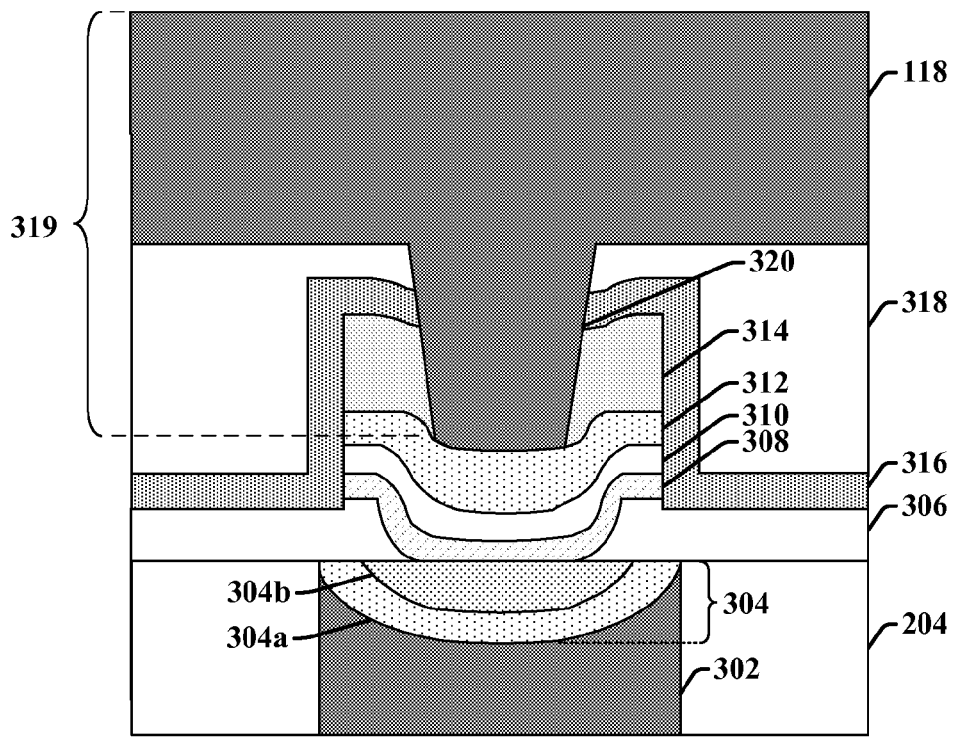

FIG. 24 illustrates some embodiments of a cross-sectional view 2400 corresponding to act 1424.

As shown in cross-sectional view 2400, an upper metal interconnect layer 319 is formed at a position abutting the top electrode 312. In some embodiments, the upper metal interconnect layer 319 comprises an upper metal via 320 and an upper metal wire 118. In some embodiments, the upper metal interconnect layer 319 may be formed by etching the upper ILD layer 318 to form an opening that extends through the top dielectric layer 316 and the planar masking layer 314 to the top electrode 312. The opening is then filed to form an upper metal via 320, which extends from a top surface of the top electrode 312 to the upper metal wire 118.

Therefore, the present disclosure relates to a resistive random access memory (RRAM) cell having a bottom electrode with a flat top that provides for low leakage currents within the RRAM cell without using insulating sidewall spacers, and an associated method of formation.

In some embodiments, the present disclosure relates to a resistive random access memory (RRAM) cell. The RRAM cell comprises a bottom electrode disposed over a lower metal interconnect layer surrounded by a lower inter-level dielectric (ILD) layer, and a bottom dielectric layer disposed over the lower metal interconnect layer or the lower ILD layer. The RRAM cell further comprises a dielectric data storage layer having a variable resistance and a top electrode disposed over the dielectric data storage layer. A bottom surface of the dielectric data storage layer abuts top surfaces of the bottom dielectric layer and the bottom electrode.

In other embodiments, the present disclosure relates to a resistive random access memory (RRAM) cell. The RRAM cell comprises a bottom electrode disposed over a lower metal interconnect layer surrounded by a lower inter-level dielectric (ILD) layer. A bottom dielectric layer is disposed over the lower metal interconnect layer or the lower ILD layer. A dielectric data storage layer having a variable resistance is located over the bottom electrode, and a top electrode is disposed over the dielectric data storage layer. A masking layer that is substantially devoid of oxygen disposed over the top electrode. The masking layer has sidewalls that are vertically aligned with sidewalls of the top electrode.

In yet other embodiments, the present disclosure relates to a method of forming a resistive random access memory (RRAM) cell. The method comprises forming a bottom electrode over a lower metal interconnect layer comprised within a lower inter-level dielectric (ILD) layer, and forming a bottom dielectric layer over the lower metal interconnect layer or the lower ILD layer. The method further comprises forming a dielectric data storage layer having a variable resistance above the bottom dielectric layer and the bottom electrode, and forming a top electrode over the dielectric data storage layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM) cell, comprising:
   a bottom electrode disposed over a lower metal interconnect layer surrounded by a lower inter-level dielectric (ILD) layer;
   a bottom dielectric layer disposed over the lower metal interconnect layer or the lower ILD layer;
   a dielectric data storage layer having a variable resistance, wherein a bottom surface of the dielectric data storage layer abuts top surfaces of the bottom dielectric layer and the bottom electrode; and
   a top electrode disposed over the dielectric data storage layer.

2. The RRAM cell of claim 1, further comprising:
   a top dielectric layer continuously extending from a first position overlying the top electrode to a second position abutting the dielectric data storage layer, wherein the top dielectric layer abuts a sidewall of the top electrode.

3. The RRAM cell of claim 2, further comprising:
   a capping layer disposed between the dielectric data storage layer and the top electrode and having a sidewall that is laterally aligned with sidewalls of the dielectric data storage layer and the top electrode.

4. The RRAM cell of claim 1,
   wherein the bottom electrode is surrounded by the bottom dielectric layer; and
   wherein a top surface of the bottom electrode shares a planar surface with a top surface of the bottom dielectric layer.

5. The RRAM cell of claim 1, wherein the bottom electrode has a smaller width than the dielectric data storage layer, so that the dielectric data storage layer extends beyond the bottom electrode on opposing sides.

6. The RRAM cell of claim 1,
   wherein the bottom electrode comprises a convex bottom surface that abuts a convex top surface of the lower metal interconnect layer; and
   wherein the top surface of the bottom electrode shares a planar surface with a top surface of the lower ILD layer.

7. The RRAM cell of claim 6,
   wherein the bottom electrode has a flat top surface connected to the bottom surface by way of curved sidewalls; and
   wherein the bottom surface comprises a curved surface so that the sidewalls and the bottom surface form a continuous curved surface that extends between opposing sides of the flat top surface.

8. The RRAM cell of claim 1, wherein the bottom electrode comprises:
   a first bottom electrode layer disposed onto the lower metal interconnect layer, wherein the first bottom electrode layer comprises a first material;
   a second bottom electrode layer nested within the first bottom electrode layer, wherein the second bottom electrode layer comprises a second material different than the first material; and
   wherein the first bottom electrode layer and the second bottom electrode layer have top surfaces that are aligned along a planar surface.

9. The RRAM cell of claim 1, wherein the dielectric data storage layer and the top electrode comprise planar layers.

10. The RRAM cell of claim 1, wherein the dielectric data storage layer and the top electrode comprise non-planar layers.

11. A resistive random access memory (RRAM) cell, comprising:
    a bottom electrode disposed over a lower metal interconnect layer surrounded by a lower inter-level dielectric (ILD) layer;
    a bottom dielectric layer disposed over the lower metal interconnect layer or the lower ILD layer;
    a dielectric data storage layer having a variable resistance located over the bottom electrode;
    a top electrode disposed over the dielectric data storage layer; and
    a masking layer that is substantially devoid of oxygen disposed over the top electrode, wherein the masking layer has sidewalls that are vertically aligned with sidewalls of the top electrode.

12. The RRAM cell of claim 11, wherein the bottom electrode comprises a flat top surface connected to a flat bottom surface by way of curved sidewalls.

13. The RRAM cell of claim 12,
    wherein the bottom electrode is surrounded by a bottom dielectric layer disposed over the lower metal interconnect layer or the lower ILD layer; and
    wherein the flat top surface of the bottom electrode shares a planar surface with a top surface of the bottom dielectric layer.

14. The RRAM cell of claim 12,
    wherein the bottom electrode comprises a convex bottom surface that abuts a convex top surface of the lower metal interconnect layer; and
    wherein the flat top surface of the bottom electrode shares a planar surface with a top surface of the lower ILD layer.

15. The RRAM cell of claim 14, wherein the bottom surface comprises a curved surface so that the sidewalls and the bottom surface form a continuous curved surface that extends between opposing sides of the flat top surface.

16. An RRAM cell, comprising:
    a bottom electrode disposed over a lower metal interconnect layer and comprising a substantially planar upper surface;
    a bottom dielectric layer disposed over the lower metal interconnect layer;
    a dielectric data storage layer having a variable resistance, wherein a bottom surface of the dielectric data storage layer abuts the substantially planar upper surface of the bottom electrode and the bottom dielectric layer; and
    a top electrode disposed over the dielectric data storage layer.

17. The RRAM cell of claim 16, wherein the bottom electrode comprises curved sidewalls.

18. The RRAM cell of claim 16, wherein the bottom electrode comprises:
    a first bottom electrode layer disposed onto the lower metal interconnect layer and comprising a first material;
    a second bottom electrode layer nested within the first bottom electrode layer and comprising a second material different than the first material; and
    wherein the first bottom electrode layer and the second bottom electrode layer have upper surfaces that are aligned along a planar surface.

19. The RRAM cell of claim 1, wherein the bottom dielectric layer laterally extends between the dielectric data storage and the bottom electrode.

20. The RRAM cell of claim 2, further comprising:
an upper metal interconnect layer surrounded by an upper ILD layer and vertically extending through a masking layer vertically arranged between the top electrode and the top dielectric layer, wherein the masking layer has outer sidewalls that are vertically aligned with outer sidewalls of the top electrode.

* * * * *